(12) United States Patent
Song et al.

(10) Patent No.: US 8,934,313 B2
(45) Date of Patent: Jan. 13, 2015

(54) NEGATIVE VOLTAGE GENERATOR AND SEMICONDUCTOR MEMORY DEVICE

(75) Inventors: Tae-Joong Song, Seongnam-si (KR); Gyu-Hong Kim, Seoul (KR); Jae-Seung Choi, Suwon-si (KR); Soung-Hoon Sim, Yongin-si (KR); In-Gyu Park, Seoul (KR); Chan-Ho Lee, Hwaseong-si (KR); Hyun-Su Choi, Suwon-si (KR); Jong-Hoon Jung, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 195 days.

(21) Appl. No.: 13/358,121

(22) Filed: Jan. 25, 2012

(65) Prior Publication Data

US 2012/0206988 A1 Aug. 16, 2012

(30) Foreign Application Priority Data

Feb. 15, 2011 (KR) .......................... 10-2011-0013155

(51) Int. Cl.
*G11C 7/12* (2006.01)
*G11C 5/14* (2006.01)
*G11C 11/419* (2006.01)

(52) U.S. Cl.
CPC .............. *G11C 11/419* (2013.01); *G11C 5/145* (2013.01); *G11C 7/12* (2013.01)
USPC . 365/203; 365/226; 365/189.09; 365/189.07; 365/189.11; 365/189.16

(58) Field of Classification Search
USPC ............. 365/203, 194, 191, 189.011, 189.16, 365/226, 227, 228, 189.01, 189.07, 145, 365/189.09, 189.11, 202, 154
See application file for complete search history.

(56) References Cited

U.S. PATENT DOCUMENTS 6,671,201 B2 12/2003 Masuda
7,366,007 B2 4/2008 Kanehara

FOREIGN PATENT DOCUMENTS

JP 2002-298586 10/2002
JP 2006-323950 11/2006
JP 2009-295246 12/2009

OTHER PUBLICATIONS

International Journal of Computer Applications (0975-0887) vol. 78—No. 2, Sep. 2013 Title: Stable and Low Power 6T SRAM Author: Mamatha Samson Alumni of International Institute of Information Technology Hyderabad.*

(Continued)

*Primary Examiner* — Richard Elms
*Assistant Examiner* — Mohammed A Bashar
(74) *Attorney, Agent, or Firm* — F. Chau & Associates, LLC

(57) ABSTRACT

A negative voltage generator includes a variable-capacitance negative voltage generating unit, a switching unit and a positive voltage applying unit. The negative voltage generating unit includes a plurality of coupling capacitors for varying the capacitance in which the negative voltage is charged. The negative voltage generating unit selects at least one coupling capacitor of the plurality of coupling capacitors according to the number of rows (size) of a memory bank to which data is written, and charges the at least one selected coupling capacitor to a negative voltage. The switching unit selects one bitline of a bitline pair having complementary first and second bitlines in response to the data, and connects the at least one selected coupling capacitor to the selected bitline. The positive voltage applying unit applies a positive (high) voltage to an other bitline of the bitline pair.

15 Claims, 10 Drawing Sheets

(56) References Cited

OTHER PUBLICATIONS

IEEE Transactions on Very Large Scale Integration (VLSI) Systems, Vol. 19, No. 1, Jan. 2011 SRAM Write-Ability Improvement With Transient Negative Bit-Line Voltage Saibal Mukhopadhyay, Member, IEEE, Rahul M. Rao, Member, IEEE, Jae-Joon Kim, Member, IEEE, and Ching-Te Chuang, Fellow, IEEE.*

* cited by examiner

NEGATIVE VOLTAGE GENERATOR AND SEMICONDUCTOR MEMORY DEVICE

CROSS-REFERENCE TO RELATED APPLICATIONS

This U.S. non-provisional application claims the benefit of priority under 35 U.S.C. §119 to Korean Patent Application No. 2011-0013155 filed on Feb. 15, 2011 in the Korean Intellectual Property Office (KIPO), which is incorporated herein by reference in its entirety.

BACKGROUND

1. Technical Field

Exemplary embodiments relate to semiconductor memory devices. More particularly, exemplary embodiments relate to negative voltage generators and semiconductor memory devices.

2. Description of the Related Art

A power supply voltage provided to a semiconductor memory device tends to decrease to reduce power consumption. As the power supply voltage decreases, a write time for writing data to the semiconductor memory device may increase, or desired data may not be stored in the semiconductor memory device if the write time is insufficient.

SUMMARY

Some exemplary embodiments provide a negative voltage generator capable of providing the same negative voltage to memory banks having different numbers of rows. The negative voltage generator includes a variable capacitance unit having a plurality of capacitance states. The negative voltage generator may included a plurality of discrete capacitors connected through switches in parallel to a pair of nodes. The plurality of capacitance states are selected by operating the switches to connect or disconnect the plurality of discrete capacitors in parallel. The negative voltage generator is configured to charge the variable capacitance unit in a first capacitance state to a negative voltage and then to apply the stored negative voltage charge in the variable capacitance unit to the global bitline pair while data is written to the first memory bank. The stored negative voltage charge is then divided between the variable capacitance unit and the parasitic capacitance of the global bitline pair and the parasitic capacitance of the first local bitline pair. The negative voltage generator is also configured to charge the variable capacitance unit in a second capacitance state to the same negative voltage and then to apply the negative voltage charged in the variable capacitance unit to the global bitline pair while the data is written to the second memory bank. The stored negative voltage charge is then divided between the variable capacitance unit and the parasitic capacitance of the global bitline pair and the parasitic capacitance of the second local bitline pair.

Some exemplary embodiments provide a semiconductor memory device that rapidly and correctly performs a write operation by providing a negative voltage having substantially the same voltage level to two or more memory banks having two or more different numbers of rows.

According to exemplary embodiments, a negative (low) voltage generator includes a negative voltage generating unit, a switching unit. The semiconductor memory device may further include a positive (high) voltage applying unit as a complement to the negative (low) voltage generator. The negative voltage generating unit includes a plurality of coupling capacitors. The negative voltage generating unit selects at least one coupling capacitor of the plurality of coupling capacitors according to the parasitic capacitance of a local bitline (which depends on the number of rows) of a memory bank to which data is written, and charges the at least one selected coupling capacitor to a negative voltage. The switching unit selects one bitline of a bitline pair having complementary first and second bitlines in response to the data, and couples the at least one selected coupling capacitor to the selected bitline. The high voltage applying unit applies a positive (high) voltage to the other (complementary) bitline of the selected bitline pair.

In some embodiments, the plurality of coupling capacitors may include a first coupling capacitor having a first electrode and a second electrode connected to an output node of the negative voltage generating unit, and a second coupling capacitor having a third electrode and a fourth electrode connected to the output node. The negative voltage generating unit may include an inverter configured to invert a write assist signal, a first switch configured to switchably connect an output terminal of the inverter to the first electrode of the first coupling capacitor in response to a first bank select signal, an OR-gate configured to perform an OR operation on the first bank select signal and a second bank select signal, a second switch configured to switchably connect the output terminal of the inverter to the third electrode of the second coupling capacitor in response to an output signal of the OR-gate, and a pull-down transistor configured to pull down a voltage of the output node in response to an inverted write assist signal.

In some embodiments, the first bank select signal ma have a logic high level when the data is written to a first memory bank having a first number of rows, and the second bank select signal may have the logic high level when the data is written to a second memory bank having a second number of rows that is different from the first number of rows. All of the first and second coupling capacitors may be charged to the negative voltage when the first bank select signal has the logic high level, and only the second coupling capacitor may be charged to the negative voltage when the second bank select signal has the logic high level.

In some embodiments, the first coupling capacitor may have a capacitance corresponding to the difference between the first number of rows and the second number of rows.

In some embodiments, the first switch may include a first NMOS transistor having its source connected to the output terminal of the inverter, its drain connected to the first electrode of the first coupling capacitor, and a control gate to which the first bank select signal is applied, and the second switch may include a second NMOS transistor having its source connected to the output terminal of the inverter, its drain connected to the third electrode of the second coupling capacitor, and a control gate to which the output signal of the OR-gate is applied.

In some embodiments, the pull-down transistor may include a third NMOS transistor having its source connected to a ground voltage, its drain connected to the output node, and a control gate to which the inverted write assist signal is applied.

In some embodiments, the switching unit may include a third switch configured to couple the at least one selected coupling capacitor to the first bitline when the data has a logic high level, and a fourth switch configured to coupled the at least one selected coupling capacitor to the second bitline when the data has a logic low level.

In some embodiments, the high voltage applying unit may include a first PMOS transistor having its source connected to a power supply voltage, its drain connected to the first bitline, and a control gate connected to the second bitline, and a second PMOS transistor having its source connected to the power supply voltage, its drain connected to the second bitline, and a control gate connected to the first bitline.

In some embodiments, the negative voltage generating unit may include an inverter configured to invert a write assist signal, a plurality of switch-capacitor circuits coupled between an output node of the negative voltage generating unit and an output terminal of the inverter, the plurality of switch-capacitor circuits including the plurality of coupling capacitors, respectively, and a pull-down transistor configured to pull down a voltage of the output node in response to an inverted write assist signal.

In some embodiments, the plurality of coupling capacitors may include a first coupling capacitor, a second coupling capacitor and a third coupling capacitor. In such embodiments, the plurality of switch-capacitor circuits includes a first switch-capacitor circuit having the first coupling capacitor, a second switch-capacitor circuit having the second coupling capacitor and a third switch-capacitor circuit having the third coupling capacitor. The capacitance of the second coupling capacitor may be about double the capacitance of the first coupling capacitor, and the capacitance of the third coupling capacitor may be about double the capacitance of the second coupling capacitor.

In some embodiments, each of the plurality of switch-capacitor circuits may include one of the plurality of coupling capacitors, and a switch configured to control a connection of the one of the plurality of coupling capacitors.

According to exemplary embodiments, a semiconductor memory device includes a first memory bank, a first bank select unit, a second memory bank, a second bank select unit and a negative voltage generator. The first memory bank includes first memory cells connected to a first local bitline pair. The first bank select unit connects a global bitline pair to the first local bitline pair in response to a first bank select signal. The second memory bank includes second memory cells connected to a second local bitline pair. The second bank select unit connects the global bitline pair to the second local bitline pair in response to a second bank select signal. The negative voltage generator includes a plurality of coupling capacitors. The negative voltage generator charges at least one first coupling capacitor of the plurality of coupling capacitors to a negative voltage to provide the negative voltage charged in the first coupling capacitor to the global bitline pair when data is written to the first memory bank, and charges at least one second coupling capacitor of the plurality of coupling capacitors to the negative voltage to provide the negative voltage charged in the second coupling capacitor to the global bitline pair when the data is written to the second memory bank.

In some embodiments, the first coupling capacitor may have the capacitance corresponding to the sum of the parasitic capacitance of the global bitline pair and the parasitic capacitance of the first local bitline pair, and the second coupling capacitor may have the capacitance corresponding to the sum of the parasitic capacitance of the global bitline pair and the parasitic capacitance of the second local bitline pair.

In some embodiments, a voltage level of the negative voltage applied to the first local bitline pair when the first bank select signal has a logic high level may be substantially the same as a voltage level of the negative voltage applied to the second local bitline pair when the second bank select signal has the logic high level.

In some embodiments, a number of the first memory cells connected to the first local bitline pair may be different from a number of the second memory cells connected to the second local bitline pair.

As described above, a negative voltage generator and a semiconductor memory device according to exemplary embodiments may provide a negative voltage having substantially the same voltage level to memory banks having different number of rows. Further, a negative voltage generator and a semiconductor memory device according to exemplary embodiments may rapidly and correctly perform a write operation.

Various exemplary embodiments will be described more fully hereinafter with reference to the accompanying drawings, in which some exemplary embodiments are shown. The present inventive concept may, however, be embodied in many different forms and should not be construed as limited to the exemplary embodiments set forth herein. In the drawings, the sizes and relative sizes of capacitors, areas, switches, and regions may be exaggerated for clarity or drawn the same for convenience of illustration.

It will be understood that when an element or layer is referred to as being "on," "connected to" or "connected to" another element or layer, it can be directly on, connected or connected to the other element or layer or intervening elements or layers may be present. In contrast, when an element is referred to as being "directly on," "directly connected to" or "directly connected to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

BRIEF DESCRIPTION OF THE DRAWINGS

Illustrative exemplary embodiments will be more clearly understood from the following detailed description taken in conjunction with the accompanying drawings.

DETAILED DESCRIPTION OF EXEMPLARY EMBODIMENTS OF THE INVENTIVE CONCEPT

Figure 1:
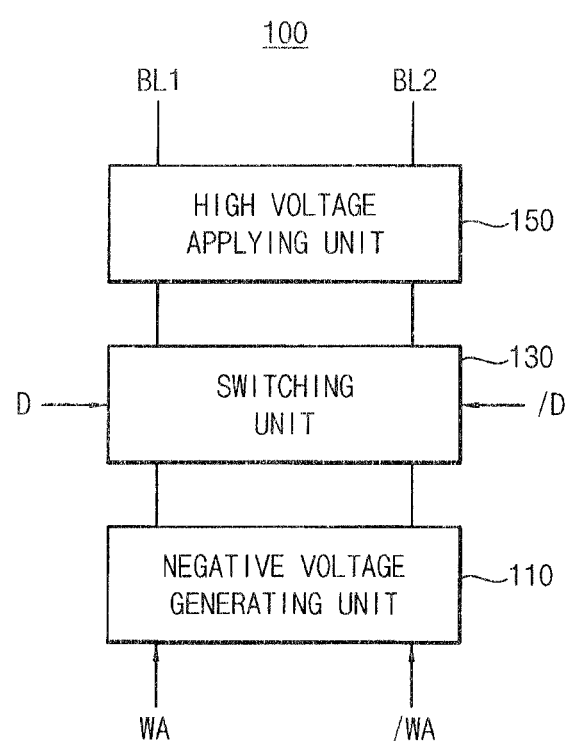
FIG. 1 is a block diagram of a negative voltage generator according to an exemplary embodiment.

FIG. 1 is a block diagram of a negative voltage generator according to exemplary embodiments.

Referring to FIG. 1, a negative voltage generator 100 includes a negative voltage generating unit 110, a switching unit 130 and a positive (high) voltage applying unit 150.

The negative voltage generating unit 110 includes a plurality of coupling capacitors and switches (112*a*, 113*a*, 116*a*, and 117*a*) that implement a variable capacitance unit which behaves as a variable capacitor having multiple selectable discrete capacitance values. The negative voltage generating unit 110 charges at least one of the coupling capacitors to a negative voltage in response to a write assist signal WA and an inverted write assist signal /WA. For example, the write assist signal WA and the inverted write assist signal /WA may be provided from a control block (not shown) of a semiconductor memory device when a write operation is performed in the semiconductor memory device.

The negative voltage generating unit 110 selects at least one coupling capacitor among the coupling capacitors in response to a bank select signal, and charges the selected coupling capacitor to the negative voltage in response to the write assist signal WA and the inverted write assist signal /WA. For example, the negative voltage generating unit 110 may select the coupling capacitor having a capacitance corresponding to the parasitic capacitance of a bitline pair BL1 and BL2 connected to a memory bank indicated by the bank select signal. Thus, the negative voltage generating unit 110 may select the coupling capacitor having a capacitance corresponding to the number of rows of the memory bank (or to the length of the bitline pair BL1 and BL2). Accordingly, the negative voltage generator 100 may provide the negative voltage having substantially the same voltage level to memory banks having different numbers of rows. According to exemplary embodiments, the bank select signal may be a bank address signal indicating the memory bank, or may be a signal generated by decoding the bank address signal.

For example, the negative voltage generator 100 may provide the negative voltage to first and second memory banks having different number of rows. When a write operation for the first memory bank is performed (i.e., when the bank select signal indicates the first memory bank), the negative voltage generating unit 110 charges at least one first coupling capacitor to the negative voltage. When a write operation for the second memory bank is performed (i.e., when the bank select signal indicates the second memory bank), the negative voltage generating unit 110 charge at least one second coupling capacitor to the negative voltage. Since the first memory bank and the second memory bank have different number of rows, bitline pairs connected to the first and second memory banks may have different lengths, and thus may have different parasitic capacitances. The first coupling capacitor may have a capacitance corresponding to the first parasitic capacitance of a first bitline pair connected to the first memory bank, and the second coupling capacitor may have a capacitance corresponding to the second parasitic capacitance of a second bitline pair connected to the second memory bank. Accordingly, although the first parasitic capacitance is different from the second parasitic capacitance, the negative voltage applied to the first bitline pair may have a voltage level substantially the same as that of the negative voltage applied to the second bitline pair since the first and second coupling capacitors have capacitances that correspond to the first and second parasitic capacitances, respectively. In some embodiments, the first bitline pair may include a global bitline pair and a first local bitline pair, and the second bitline pair may include the global bitline pair and a second local bitline pair. In this case, the first parasitic capacitance may correspond to the sum of the parasitic capacitance of the global bitline pair and of the parasitic capacitance of the first local bitline pair; and the second parasitic capacitance may correspond to the sum of the parasitic capacitance of the global bitline pair and the parasitic capacitance of the second local bitline pair.

The switching unit 130 switchably conductively connects the selected coupling capacitor of the negative voltage generating unit 110 to one bitline of the bitline pair BL1 and BL2 in response to data D and/or inverted data /D. The bitline pair BL1 and BL2 includes complementary first and second bitlines BL1 and BL2, and the switching unit 130 may connects the selected coupling capacitor to one of the first and second bitlines BL1 and BL2. For example, in a case where the data D has a logic high level and the inverted data /D has a logic low level, the switching unit 130 connects the selected coupling capacitor to the first bitline BL1. In a case where the data D has the logic low level and the inverted data /D has the logic high level, the switching unit 130 connects the selected coupling capacitor to the second bitline BL2. Accordingly, the negative voltage charged in the selected coupling capacitor will be applied to the first bitline BL1 or the second bitline BL2 depending upon the logic value of the data D.

The positive (high) voltage applying unit 150 applies a positive (high) voltage to the other bitline (i.e., to the bitline that is not connected to the selected coupling capacitor). Thus, the positive (high) voltage applying unit 150 applies the positive (high) voltage to the bitline among the first bitline BL1 or the second bitline BL2 to which the negative voltage is not applied. For example, in a case where the switching unit 130 couples the selected coupling capacitor to the first bitline BL1, the positive (high) voltage applying unit 150 applies the positive (high) voltage to the second bitline BL2. In a case where the switching unit 130 connects the selected coupling capacitor to the second bitline BL2, the positive (high) voltage applying unit 150 applies the positive (high) voltage to the first bitline BL1. In various exemplary embodiments, the positive (high) voltage may be a power supply voltage of the semiconductor memory device.

As described above, since the negative voltage generating unit 110 charges at least one of the coupling capacitors to the negative voltage, and provides the negative voltage charged in the coupling capacitors to the bitline pair BL1 and BL2, a semiconductor memory device including the negative voltage generator 100 according to exemplary embodiments may rapidly and correctly perform a write operation. Further, since the negative voltage generating unit 110 selects the coupling capacitors according to the number of rows in each memory bank, and charges the selected coupling capacitors to the negative voltage, the negative voltage generator 100 according to exemplary embodiments may provide the negative voltage having substantially the same voltage level to memory banks having different number of rows.

Figure 2:
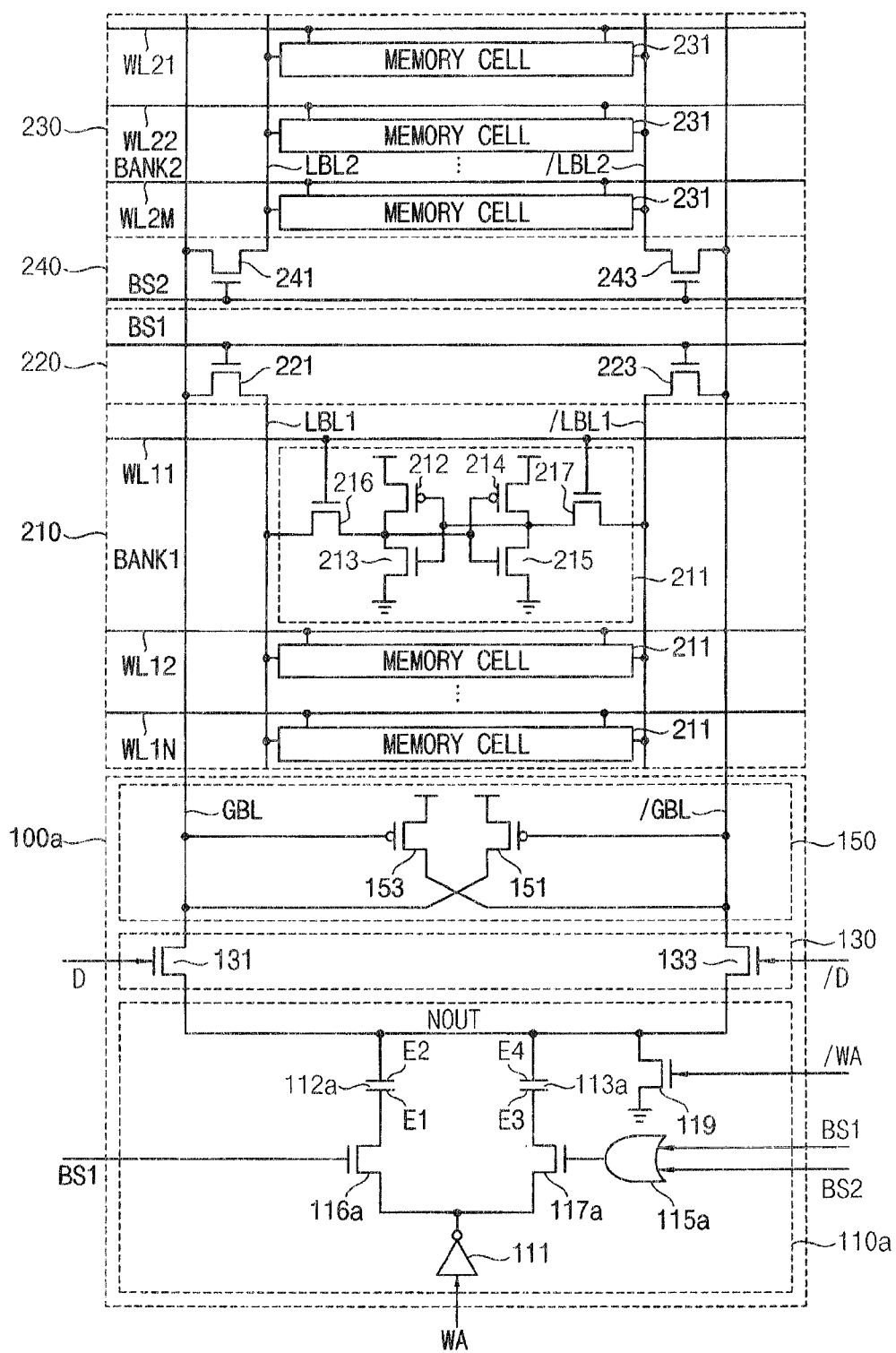
FIG. 2 is a diagram of a semiconductor memory device including a negative voltage generator according to an exemplary embodiment.

FIG. 2 is a diagram of a semiconductor memory device including a negative voltage generator 100a according to exemplary embodiments.

Referring to FIG. 2, a semiconductor memory device 200a includes a first memory bank 210, a first bank select unit 220, a second memory bank 230, a second bank select unit 240 and a negative voltage generator 100a.

The first memory bank 210 includes a plurality of first memory cells 211 connected to a first local bitline pair LBL1 and /LBL1. The second memory bank 230 includes a second plurality of memory cells 231 connected to a second local bitline pair LBL2 and /LBL2. The first local bitline pair LBL1 and /LBL1 includes complementary first and second local bitlines LBL1 and /LBL1, and the second local bitline pair LBL2 and /LBL2 includes complementary third and fourth local bitlines LBL2 and /LBL2. In some embodiments, each of the first memory cells 211 and the second memory cells 231 is a static random access memory (SRAM) cell. Each of the first memory cells 211 and the second memory cells 231 includes six transistors 212, 213, 214, 215, 216 and 217. Although for convenience of illustration, FIG. 2 illustrates the first and second memory banks 210 and 230 as each including a plurality of rows and a single column of memory cells 211 and 231, each memory bank 210 and 230 may include a plurality of rows and a plurality of columns of memory cells.

Each of the first memory cells 211 and the second memory cells 231 includes a first inverter (comprised of complementary transistors 212 and 213), a second inverter (comprised of complementary transistors 214 and 215), a first access transistor 216 and a second access transistor 217. The first inverter (212 and 213) includes a PMOS transistor 212 having its source connected to a power supply voltage, its drain connected to an input terminal of the second inverter (214 and 215), and a control gate connected to an output terminal of the second inverter (214 and 215), and an NMOS transistor 213 having its source connected to a ground voltage, its drain connected to the input terminal of the second inverter (214 and 215), and a control gate connected to the output terminal of the second inverter (214 and 215). The second inverter (214 and 215) includes a PMOS transistor 214 having its source connected to the power supply voltage, its drain connected to an input terminal of the first inverter (212 and 213), and a control gate connected to an output terminal of the first inverter (212 and 213), and an NMOS transistor 215 having its source connected to the ground voltage, its drain connected to the input terminal of the first inverter (212 and 213), and a control gate connected to the output terminal of the first inverter (212 and 213). The first access transistor 216 includes an NMOS transistor 216 having a first source/drain connected to the first local bitline LBL1, a second source/drain connected to the input terminal of the second inverter (214 and 215), and a control gate connected to a wordline WL11, and the second access transistor 217 may include an NMOS transistor 217 having a first source/drain connected to the second local bitline /LBL1, a second source/drain connected to the input terminal of the first inverter 212 and 213, and a control gate connected to the wordline WL11.

The stored Data output from the first inverter (212 and 213) is input to the second inverter (214 and 215), and the second inverter (214 and 215) outputs inverted data by inverting the stored Data. Further, the inverted data output from the second inverter (214 and 215) is input to the first inverter (212 and 213), and the first inverter (212 and 213) outputs the Data by inverting the inverted data. Accordingly, the first inverter (212 and 213) and the second inverter (214 and 215) continuously retains the Data.

When Data to be stored is written to a memory cell 211 included in the first memory bank 210, the data is applied to the first local bitline LBL1, and inverted data is applied to the second local bitline /LBL1. For example, in a case where the data of "1" is written to the memory cell 211, the voltage of the logic high level is applied as the data to the first local bitline LBL1, and the voltage of the logic low level is applied as the inverted data to the second local bitline /LBL1. Further, the voltage of the logic high level is applied to the wordline WL11 connected to the memory cell 211, and thus the first and second access transistors 216 and 217 will be turned ON. If the first and second access transistors 216 and 217 are turned ON, the data applied to the first local bitline LBL1 is input to the second inverter (214 and 215), and the inverted data applied to the second local bitline /LBL1 is input to the first inverter (212 and 213). Thus, the first inverter (212 and 213) outputs the data by inverting the inverted data, and the second inverter (212 and 213) outputs the inverted data by inverting the data. Accordingly, the data may be written into the memory cell 211 and retained therein.

As described above, in the case where the data of "1" is written to the memory cell 211, the voltage of the logic high level applied to the first local bitline LBL1 is input as the data to the second inverter (214 and 215), and the voltage of the logic low level applied to the second local bitline /LBL1 is input as the inverted data to the first inverter (212 and 213). Since each of the first and second access transistors 216 and 217 is implemented by an NMOS transistor having an efficient pull-down capacity and an inefficient pull-up capacity, the first and second access transistors 216 and 217 may efficiently transfer the voltage of the logic low level, but may inefficiently transfer the voltage of the logic high level. Thus, the voltage of the logic high level may not substantially contribute to the write operation, and the voltage of the logic low level may substantially contribute to the write operation. If the ground voltage or a voltage of about 0V is used as the voltage of the logic low level, the time required for the write operation may increase as the power supply voltage used in the semiconductor memory device decreases, or the write operation may fail if the write time is insufficient. In the semiconductor memory device 200a according to exemplary embodiments, a negative voltage generated by the negative voltage generator 100a may be used as the voltage of the logic low level, and thus the write operation may be rapidly and correctly performed even if the power supply voltage used in the semiconductor memory device is low.

The N first memory cells 211 included in the first memory bank 210 are connected to N wordlines WL11, WL12, ..., WL1N, where N is an integer greater than 1, and the M second memory cells 231 included in the second memory bank 230 are connected to M wordlines WL21, WL22, ..., WL2M, where M is an integer greater than 1. Thus, the first number of rows of the first memory bank 210 is N, and the second number of rows of the second memory bank 230 is M. If the number N of the first memory cells 211 connected to the first local bitline pair LBL1 and /LBL1 is different from the number M of the second memory cells 231 connected to the second local bitline pair LBL2 and /LBL2, the length of the first local bitline pair LBL1 and /LBL1 may be different from the length of the second local bitline pair LBL2 and /LBL2, and the parasitic capacitance of the first local bitline pair LBL1 and /LBL1 may be different from the parasitic capacitance of the second local bitline pair LBL2 and /LBL2. In this case, if the negative voltage generator 100a provides the negative voltage to the first local bitline pair LBL1 and /LBL1 and the second local bitline pair LBL2 and /LBL2 using the same coupling capacitance, the voltage level of the negative voltage applied to the first local bitline pair LBL1 and /LBL1 may be different from the voltage level of the negative voltage applied to the second local bitline pair LBL2 and /LBL2. If the voltage levels are different, an error, such as a data retention fail, a data write fail, etc., or a leakage current may occur in the semiconductor memory device. Alternatively, if the semiconductor memory device includes a plurality of negative voltage generators to provide a plurality of negative voltages to the plurality of banks, respectively, the circuit size of the semiconductor memory device may be increased. In the semiconductor memory device 200a according to exemplary embodiments, the negative voltage generator 100a generates the negative voltage using coupling capacitances respectively corresponding to the number of rows of the memory banks 210 and 230. Accordingly, the semiconductor memory device 200a according to exemplary embodiments may rapidly and correctly perform the write operation with a smaller circuit size.

The first bank select unit 220 connects the global bitline pair GBL and /GBL to the first local bitline pair LBL1 and /LBL1 in response to a first bank select signal BS1, and the second bank select unit 240 connects the global bitline pair GBL and /GBL to the second local bitline pair LBL2 and /LBL2 in response to a second bank select signal 13S2. The first bank select unit 220 includes an NMOS transistor 221 that connects the first global bitline GBL to the first local bitline LBL1 in response to the first bank select signal BS1, and an NMOS transistor 223 that connects a second global bitline /GBL to the second local bitline /LBL1 in response to the first bank select signal BS1. The second bank select unit 240 includes an NMOS transistor 241 that connects the first global bitline GBL to the third local bitline LBL2 in response to the second bank select signal BS2, and an NMOS transistor 243 that connects the second global bitline /GBL to the fourth local bitline /LBL2 in response to the second bank select signal BS2.

The Negative Voltage Generator

The negative voltage generator 100a includes a negative voltage generating unit 110a, a switching unit 130 and a positive (high) voltage applying unit 150. The negative voltage generating unit 110a generates the negative voltage. The switching unit 130 switchably connects the negative voltage generating unit 110a to the first global bitline GBL or to the second global bitline /GBL. The positive (high) voltage applying unit 150 applies a positive high voltage to the global bitline to which the negative voltage generating unit 110a is not connected.

The negative (low) voltage generating unit 110a includes an inverter 111, a first coupling capacitor 112a, a second coupling capacitor 113a, an OR-gate 115a, a first switch 116a, a second switch 117a and a pull-down transistor 119. The inverter 111 inverts the write assist signal WA received from a logic block (not shown) of the semiconductor memory device 200a. The first coupling capacitor 112a has a first electrode E1 connected to the first switch 116a and a second electrode E2 connected to an output node NOUT of the negative voltage generating unit 110a. The second coupling capacitor 113a has a third electrode E3 connected to the second switch 117a and a fourth electrode E4 connected to the output node NOUT of the negative voltage generating unit 110a. The first switch 116a switchably connects the output terminal of the inverter 111 to the first electrode E1 of the first coupling capacitor 112a in response to the first bank select signal BS1. For example, the first switch 116a includes a first NMOS transistor having its source connected to the output terminal of the inverter 111, its drain connected to the first electrode E1 of the first coupling capacitor 112a, and a control gate to which the first bank select signal BS1 is applied. The OR-gate 115a performs an OR operation on the first bank select signal BS1 and the second bank select signal BS2. The second switch 117a switchably connects the output terminal of the inverter 111 to the third electrode E3 of the second coupling capacitor 113a in response to the output of the OR-gate 115a. For example, the second switch 117a includes a second NMOS transistor having its source connected to the output terminal of the inverter 111, its drain connected to the third electrode E3 of the second coupling capacitor 113a, and a control gate to which the output signal of the OR-gate 115a is applied. The pull-down transistor 119 pulls down the voltage of the output node NOUT in response to an inverted write assist signal /WA received from the control block. For example, the pull-down transistor 119 includes a third NMOS transistor having its source connected to the ground voltage, its drain connected to the output node NOUT, and a control gate to which the inverted write assist signal /WA is applied.

The switching unit 130 includes a third switch 131 that connects the output node NOUT to the first global bitline GBL in response to the data D, and a fourth switch 133 that connects the output node NOUT to the second global bitline /GBL in response to the inverted data /D. The third switch 131 includes a fourth NMOS transistor having its source connected to the output node NOUT, its drain connected to the first global bitline GBL, and a control gate to which the data D is applied. The fourth switch 133 may include a fifth NMOS transistor having its source connected to the output node NOUT, its drain connected to the second global bitline /GBL, and a control gate to which the inverted data /D is applied.

The positive (high) voltage applying unit 150 may include a first PMOS transistor 151 having its source connected to the power supply voltage, its drain connected to the first global bitline GBL, and a control gate connected to the second global bitline /GBL, and a second PMOS transistor 153 having its source connected to the power supply voltage, its drain connected to the second global bitline /GBL, and a control gate connected to the first global bitline GBL.

When a write operation for the first memory bank 210 is performed, the first bank select signal BS1 has a logic high level, and the first and second switches 116a and 117a is turned ON. While the write assist signal WA has a logic low level and the inverted write assist signal /WA has a logic high level, the voltage of a logic high level (e.g., the power supply voltage) is applied to the first electrode E1 of the first coupling capacitor 112a and the third electrode E3 of the second coupling capacitor 113a, and the voltage of a logic low level (e.g., the ground voltage or the voltage of about 0V) is applied to the second electrode E2 of the first coupling capacitor 112a and the fourth electrode E4 of the second coupling capacitor 113a. Accordingly, the first coupling capacitor 112a and the second coupling capacitor 113a are both charged to a negative voltage corresponding to the difference between the voltage of the logic high level and the voltage of the logic low level.

If the write assist signal WA is changed from a logic low level to a logic high level, the voltage of a logic low level (e.g., the ground voltage or the voltage of about 0V) is applied to the first electrode E1 of the first coupling capacitor 112a and to the third electrode E3 of the second coupling capacitor 113a. Thus the output node NOUT has a negative voltage lower than the voltage of the logic low level (i.e., lower by the voltage charged in the first and second coupling capacitors 112a and 113a). The output node NOUT is connected to the global bitline pair GBL and /GBL, via the switching unit 130, and the global bitline pair GBL and /GBL are connected to the first local bitline pair LBL1 and /LBL1 via the first bank select unit 220. By charge sharing between the first and second coupling capacitors 112a and 113a and parasitic capacitors of the global bitline pair GBL and /GBL and the first bitline pair LBL1 and /LBL1, the negative voltage of the output node NOUT is provided to a memory cell 211 connected to the first bitline pair LBL1 and /LBL1, The negative voltage provided to the memory cell 211 is controlled by the ratio of the capacitance of the first and second coupling capacitors 112a and 113a to the capacitance of the parasitic capacitors of the global bitline pair GBL and /GBL and of the first bitline pair LBL1 and /LBL1. Accordingly, the negative voltage having a predetermined voltage level may be provided to the memory cell 211 included in the first memory bank 210.

When a write operation for the second memory bank 230 is performed, the second bank select signal BS2 has a logic high level, and the second switch 117a is turned ON, and the first bank select signal BS1 has a logic low level so that the first switch 116a is turned OFF. While the write assist signal WA has a logic low level and the inverted write assist signal /WA has a logic high level, the voltage of the logic high level is applied to the third electrode E3 of the second coupling capacitor 113a, and the voltage of the logic low level is applied to the fourth electrode E4 of the second coupling capacitor 113a. Accordingly, only the second coupling capacitor 113a (not the first coupling capacitor 112a) is charged to a negative voltage corresponding to the difference between the voltage of the logic high level and the voltage of the logic low level.

If the write assist signal WA is changed from a logic low level to a logic high level, the voltage of the logic low level is applied to the third electrode E3 of the second coupling capacitor 113a, and thus the output node NOUT will have the negative voltage that is lower than the voltage of the logic low level (i.e., lower by the voltage charged in the second coupling capacitor 113a). The output node NOUT is connected to the global bitline pair GBL and /GBL via the switching unit 130, and the global bitline pair GBL and /GBL is connected to the second local bitline pair LBL2 and /LBL2 via the second bank select unit 240. By charge sharing between the second coupling capacitor 113a and the parasitic capacitors of the global bitline pair GBL and /GBL and the second bitline pair LBL2 and /LBL2, the negative voltage of the output node NOUT is provided to a memory cell 231 connected to the second bitline pair LBL2 and /LBL2. The negative voltage provided to the memory cell 211 is controlled by the ratio of the capacitance of the second coupling capacitor 113a to the capacitance of the parasitic capacitors of the global bitline pair GBL and /GBL and the second bitline pair LBL2 and /LBL2. Accordingly, the negative voltage having a predetermined voltage level may be provided to the memory cell 231 included in the second memory bank 230.

If the first number of rows (i.e., N) of the first memory bank 210 is different from the second number of rows (i.e., M) of the second memory bank 230, the length of the first local bitline pair LBL1 and /LBL1 may be different from the length of the second local bitline pair LBL2 and /LBL2, and the parasitic capacitance of the first local bitline pair LBL1 and /LBL1 may be different from the parasitic capacitance of the second local bitline pair LBL2 and /LBL2. Thus, if the negative voltage generator generates the negative voltage using the same coupling capacitance for the write operations accessing the first memory bank 210 and accessing the second memory bank 230, the voltage level of the negative voltage provided to the first memory cell 211 connected to the first local bitline pair LBL1 and /LBL1 may be different from the voltage level of the negative voltage provided to the second memory cell 231 connected to the second bitline pair LBL2 and /LBL2. However, in the semiconductor memory device 200a according to exemplary embodiments, the negative voltage generator 100a generates the negative voltage using a combination (or using selections among) the first and second coupling capacitors 112a and 113a. When the write operation for the first memory bank 210 is performed, the negative voltage generator 100a generates the negative voltage using the capacitance of both the first and second coupling capacitors 112a and 113a that corresponds to the parasitic capacitance of the global bitline pair GBL and /GBL and the first local bitline pair LBL1 and /LBL1. When the write operation for the second memory bank 230 is performed, the negative voltage generator 100a generates the negative voltage using only the second coupling capacitor 113a having a capacitance that corresponds to the parasitic capacitance of the global bitline pair GBL and /GBL and the second local bitline pair LBL2 and /LBL2. Accordingly, the semiconductor memory device 200a according to exemplary embodiments provides the negative voltage having substantially the same voltage level alternately (i.e., at different times) to both of the memory cell 211 connected to the first local bitline pair LBL1 and /LBL1 and the memory cell 231 connected to the second local bitline pair LBL2 and /LBL2. For examples of design choices, the first coupling capacitor 112a may be designed to have a capacitance corresponding to the difference between the first number of rows and the second number of rows, or corresponding to the length difference between the first local bitline pair LBL1 and /LBL1 and the second local bitline pair LBL2 and /LBL2, and thus the negative bit line voltage having substantially the same voltage level may be provided to both of the memory cells 211 and 231.

Although FIG. 2 illustrates an example where two memory banks 210 and 230 are connected to the global bitline pair GBL and /GBL, according to exemplary embodiments, three or more memory banks having different numbers of rows in some or in each may be connected to the global bitline pair GBL and /GBL. For example, the semiconductor memory device 200a may include four or eight memory banks connected to the global bitline pair GBL and /GBL. Further, FIG. 2 illustrates an example where the negative voltage generator 100a is connected to one global bitline pair GBL and /GBL, according to exemplary embodiments, the negative voltage generator 100a may be connected to a plurality of global bitline pairs corresponding to a plurality of columns. In some embodiments, a selector, such as a demultiplexer, may be disposed between the negative voltage generator 100a and the plurality of global bitline pairs, and the selector may provide the negative voltage generated by the negative voltage generator 100a to at least one of the plurality of global bitline pairs.

Figure 3:
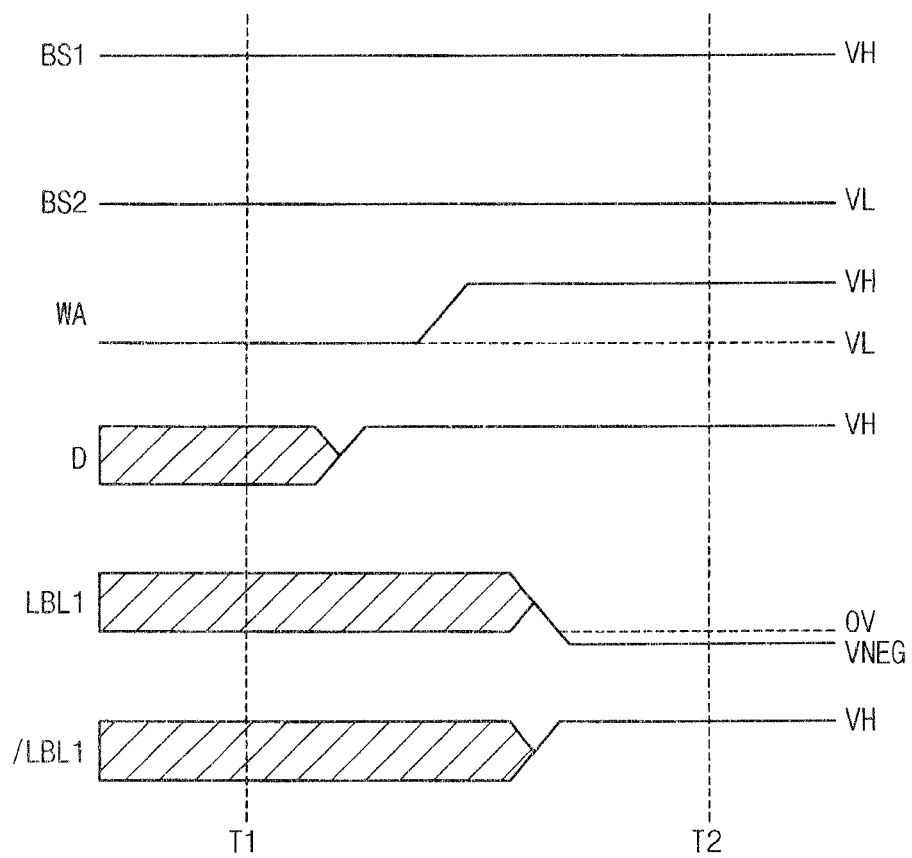
FIG. 3 is a timing diagram for describing a write operation accessing the first memory bank included in the semiconductor memory device of FIG. 2.
Figure 4A:
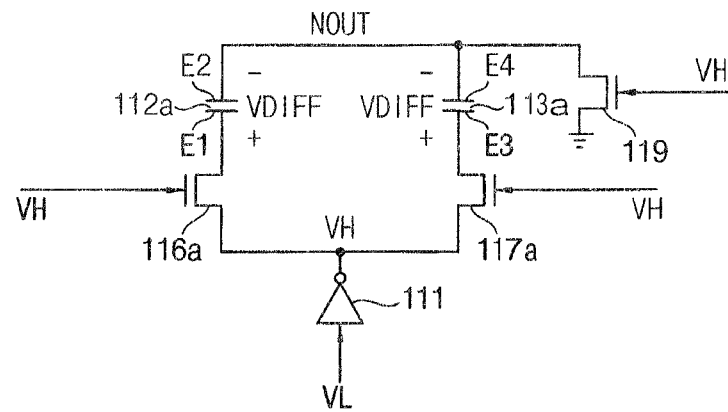
FIGS. 4A and 4B are circuit diagrams including the negative voltage generating unit 110*a* annotated for describing a write operation accessing the first memory bank included in the semiconductor memory device of FIG. 2.
Figure 4B:
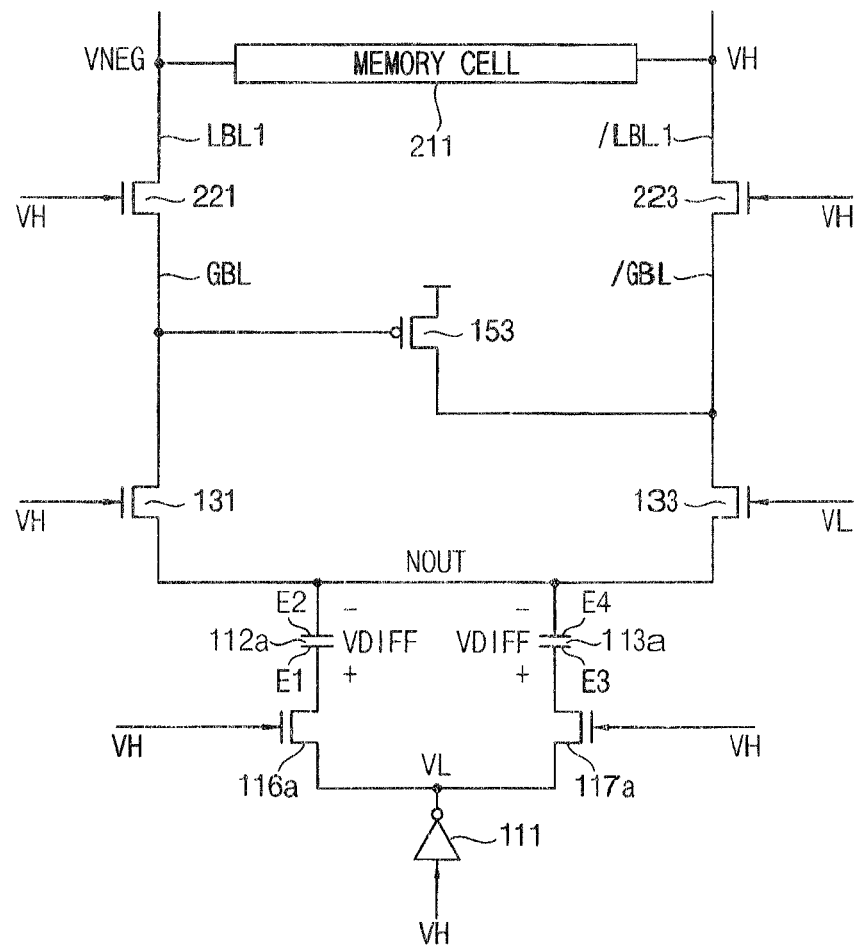

FIG. 3 is a timing diagram for describing a write operation for a first memory bank included in the semiconductor memory device 200a of FIG. 2, FIG. 4A is a circuit diagram of the negative voltage generating unit 110a in FIG. 2 annotated for describing the write operation at a first time point T1 illustrated in FIG. 3, and FIG. 4B is a circuit diagram of the negative voltage generating unit 110a connected to a memory cell 211 in the first memory bank 210 for describing the write operation at a second time point T2 illustrated in FIG. 3.

Referring to FIGS. 2, 3 and 4A, when a write operation for the first memory bank 210 is to be performed, the first bank select signal BS1 has a logic high level, and the second bank select signal BS2 has a logic low level. If the voltage VH of the logic high level is applied as the first bank select signal BS1 to a first switch 116a, the first switch 116a is turned ON. Further, if the voltage V11 of the logic high level is applied as the first bank select signal BS1 to the OR-gate 115a, the voltage VH of the logic high level is output by the OR-gate 115a to the second switch 117a, and the second switch 117a is turned ON. While the write assist signal WA has a logic low level and the inverted write assist signal /WA has a logic high level, the voltage VL of a logic low level is applied as the write assist signal WA to the inverter 111, and the inverter 111 outputs the voltage VH of the logic high level by inverting the voltage VL of the logic low level. Accordingly, the voltage VH of the logic high level is applied to a first electrode E1 of the first coupling capacitor 112a and to the third electrode E3 of a second coupling capacitor 113a.

If the voltage VH of the logic high level is applied as the inverted write assist signal /WA to the pull-down transistor 119, then the pull-down transistor 119 pulls down the output node NOUT to the ground voltage. Thus, the pull-down transistor 119 is turned ON, and the voltage VL of the logic low level is applied to the second electrode E2 of the first coupling capacitor 112a and to the fourth electrode E4 of the second coupling capacitor 113a. Accordingly, the first coupling capacitor 112a and the second coupling capacitor 113a are both charged to the voltage VDIFF corresponding to the difference between the voltage VH of the logic high level and the voltage VL of the logic low level.

Referring to FIGS. 2, 3 and 4B, while the write assist signal WA has a logic high level and the inverted write assist signal /WA has a logic low level, the voltage VH of the logic high level is applied as the write assist signal WA to the inverter 111, and the inverter 111 outputs the voltage VL of the logic low level by inverting the voltage VH of the logic high level. Accordingly, the output node NOUT has a negative voltage lower than the voltage VL of the logic low level (i.e., lower by the voltage VDIFF charged in the first and second coupling capacitors 112a and 113a).

For example, in a case where data D has a value of "1", and inverted data ID has a value of "0", the voltage VH of the logic high level is applied as the data D to the third switch 131, and the voltage VL of the logic low level is applied as the inverted data /D to the fourth switch 133. Accordingly, the third switch 131 is turned ON, and thus the output node NOUT is connected to the first global bitline GBL. If the output node NOUT is connected to the first global bitline GBL through the third switch 131, the negative voltage is applied to the first global bitline GBL, and the second PMOS transistor 153 of a high voltage applying unit 150 is turned ON. Thus the second PMOS transistor 153 pulls up the second global bitline /GBL to the voltage VH of the logic high level.

When a write operation for the first memory bank 210 is performed, the first bank select signal BS1 has a logic high level, and thus the NMOS transistors 221 and 223 of the first bank select unit 220 connect the first and second global bitlines GBL and /GBL to first and second local bitlines LBL1 and /LBL1, respectively in response to the voltage VH of the logic high level as the first bank select signal. BS1. Accordingly, the negative voltage VNEG is provided to a memory cell 211 of the first memory bank 210 through the first local bitline LBL1, and the voltage VH of the logic high level (i.e., a positive high voltage) is provided to the memory cell 211 through the second local bitline /LBL1. For a design example, the negative voltage VNEG provided to the memory cell 211 may range from about −300 mV to about −100 mV.

As described above, the negative voltage generator 100a according to exemplary embodiments provides the negative voltage VNEG having a predetermined voltage level to the memory cell 211 of the selected one the first or the second memory banks 210 or 230 based on using the first and second coupling capacitors 112a and 113a. The first and second coupling capacitors 112a and 113a have capacitances corresponding to the sum of the parasitic capacitance of the first global bitline GBL and the parasitic capacitance of the first local bitline LBL1 (or the sum of the parasitic capacitance of the second global bitline /GBL and the parasitic capacitance of the second local bitline /LBL1).

Figure 5:
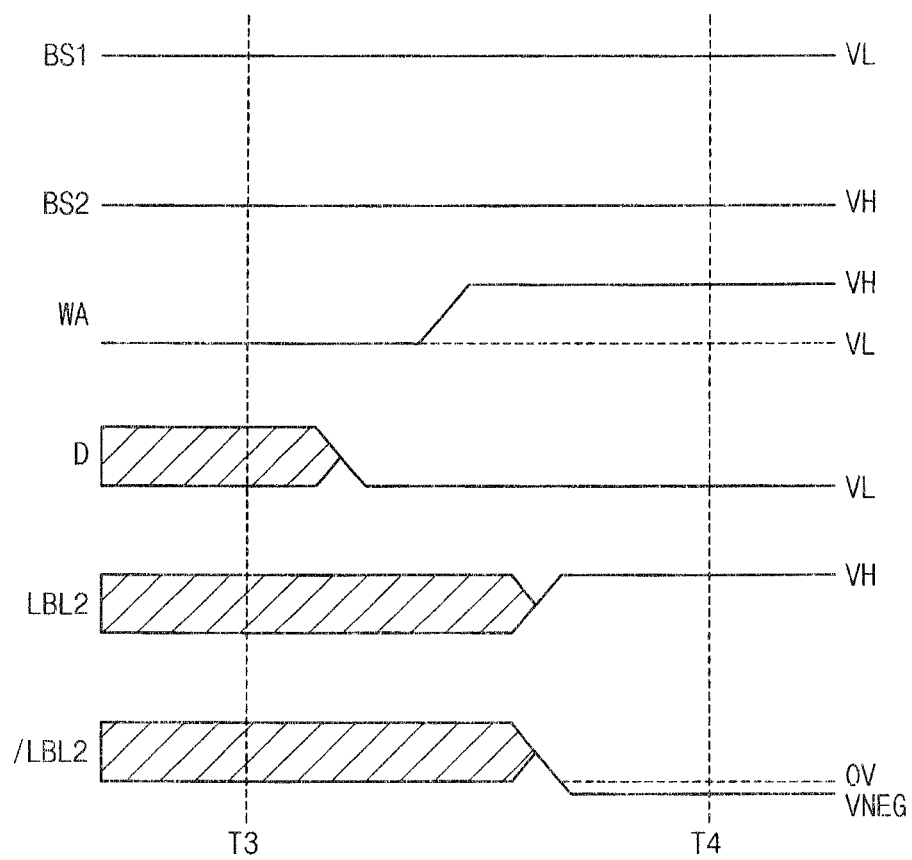
FIG. 5 is a timing diagram for describing a write operation accessing the second memory bank included in the semiconductor memory device of FIG. 2.
Figure 6A:
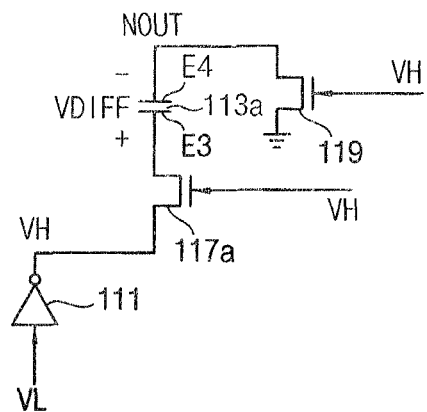
FIGS. 6A and 6B are diagrams for describing a write operation accessing the second memory bank included in the semiconductor memory device of FIG. 2.
Figure 6B:
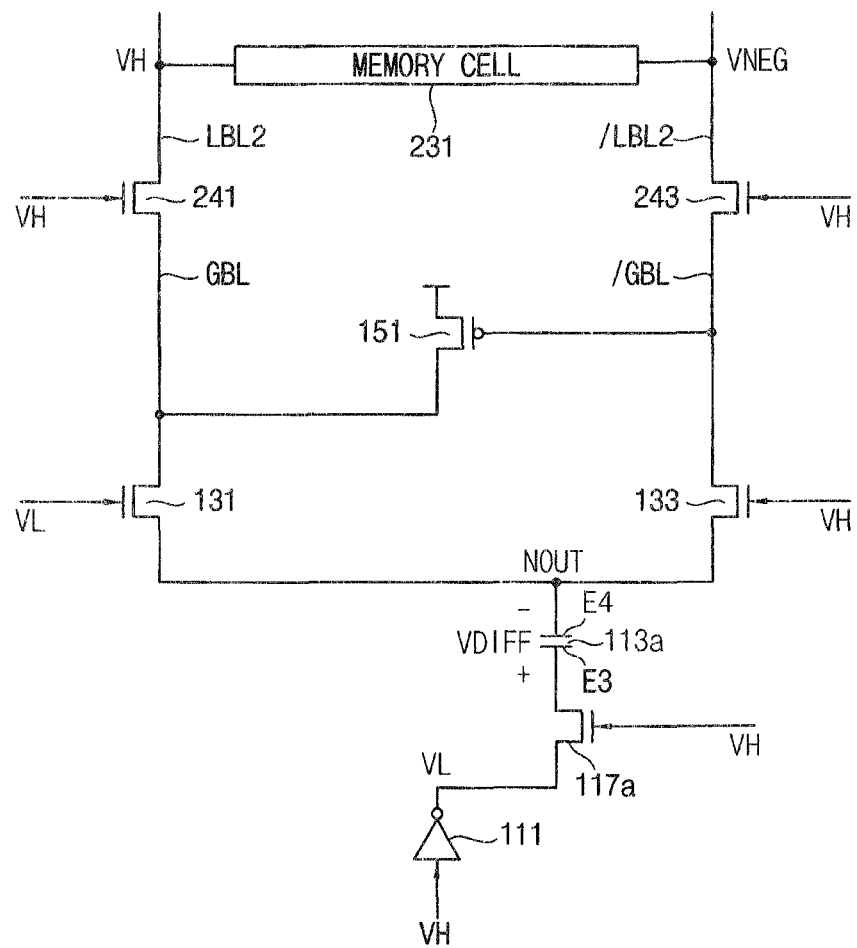

FIG. 5 is a timing diagram for describing a write operation accessing the second memory bank 230 included in the semiconductor memory device 200a of FIG. 2, FIG. 6A is a circuit diagram of the negative voltage generating unit 110a in FIG. 2 annotated for describing the write operation at a third time point T3 illustrated in FIG. 5, and FIG. 6B is a circuit diagram of the negative voltage generating unit 110a connected to a memory cell 231 in the second memory bank 230 annotated for describing the write operation at a fourth time point T4 illustrated in FIG. 5.

Referring to FIGS. 2, 5 and 6A, when a write operation accessing the second memory bank 230 is to be performed, the first bank select signal BS1 has a logic low level, and the second bank select signal BS2 has a logic high level. While the voltage VH of the logic high level is applied as the second bank select signal BS2 to the OR-gate 115a, the voltage VH of the logic high level is output by the OR-gate 115a to the second switch 117a, and the second switch 117a is turned ON. While a write assist signal WA has a logic low level and the inverted write assist signal /WA has a logic high level, the voltage VL of a logic low level is applied as the write assist signal WA to the inverter 111, and the inverter 111 outputs the voltage VH of the logic high level by inverting the voltage VL of the logic low level. Accordingly, the voltage VH of the logic high level is applied only to the third electrode E3 of the second coupling capacitor 113a.

while the voltage VH of the logic high level is applied as the inverted write assist signal /WA to the pull-down transistor 119, the pull-down transistor 119 pulls down the output node NOUT to the ground voltage. Thus, the pull-down transistor 119 is turned ON, and thus the voltage VL of the logic low level is applied only to the fourth electrode E4 of the second coupling capacitor 113a. Accordingly, only the second coupling capacitor 113a is charged to the voltage VDIFF corresponding to the difference between the voltage VH of the logic high level and the voltage VL of the logic low level.

Referring to FIGS. 2, 5 and 6B, while the write assist signal WA has a logic high level and the inverted write assist signal /WA has a logic low level, the voltage VH of the logic high level is applied as the write assist signal WA to the inverter 111, and the inverter 111 outputs the voltage VL of the logic low level by inverting the voltage VH of the logic high level. Accordingly, the output node NOUT has a negative voltage lower than the voltage VL of the logic low level (i.e., lower by the voltage VDIFF charged in the second coupling capacitor 113a).

For example, in a case where data D has a value of "0", and inverted data /D has a value of "1", the voltage VL of the logic low level is applied as the data D to the third switch 131, and the voltage VH of the logic high level is applied as the inverted data /D to the fourth switch 133. Accordingly, the fourth switch 133 is turned ON, and the output node NOUT is connected to a second global bitline /GBL. While the output node NOUT is connected to the second global bitline /GBL, the negative voltage is applied to the second global bitline /GBL, and the first PMOS transistor 151 of a positive (high) voltage applying unit 150 is turned ON. Thus, the first PMOS transistor 151 pulls up the first global bitline GBL to the voltage VH of the logic high level.

When a write operation for the second memory bank 230 is performed, the second bank select signal BS2 has a logic high level, and thus the NMOS transistors 241 and 243 of a second bank select unit 240 connect the first and second global bitlines GBL and /GBL to third and fourth local bitlines LBL2 and /LBL2, respectively, in response to the voltage VH of the logic high level of the second bank select signal BS2. Accordingly, the voltage VH of the logic high level (i.e., a positive high voltage) is provided to a memory cell 231 the second memory bank 230 through the third local bitline LBL2, and the negative voltage VNEG is provided to the memory cell 231 through the fourth local bitline /LBL2. For a design example, the negative voltage VNEG provided to the memory cell 231 may range from about −300 mV to about −100 mV.

As described above, the negative voltage generator 100a according to exemplary embodiments provides the negative voltage VNEG having a predetermined voltage level to the memory cell 231 using only the second coupling capacitor 113a having a capacitance corresponding to the sum of the parasitic capacitance of the second global bitline /GBL and the parasitic capacitance of the fourth local bitline /LBL2 (or the sum of the parasitic capacitance of the first global bitline GBL and the parasitic capacitance of the third local bitline LBL2). Further, since the capacitance of the first and second coupling capacitors 112a and 113a correspond to the sum of the parasitic capacitance of the first global bitline GBL (or the second global bitline /GBL) and the parasitic capacitance of the first local bitline LBL1 (or the second local bitline /LBL1), and the capacitance of the second coupling capacitor 113a corresponds to the sum of the parasitic capacitance of the first global bitline GBL (or the second global bitline /GBL) and the parasitic capacitance of the third local bitline LBL2 (or the fourth local bitline /LBL2), the negative voltage VNEG provided to the memory cell 211 included in the first memory bank 210 and the negative voltage VNEG provided to the memory cell 231 included in the second memory bank 230 may have substantially the same voltage level. For a design example, the negative voltage VNEG provided to the memory cell 211 of the first memory bank 210 or the memory cell 231 of the second memory bank 230 may range from about −300 mV to about −100 mV.

Figure 7:
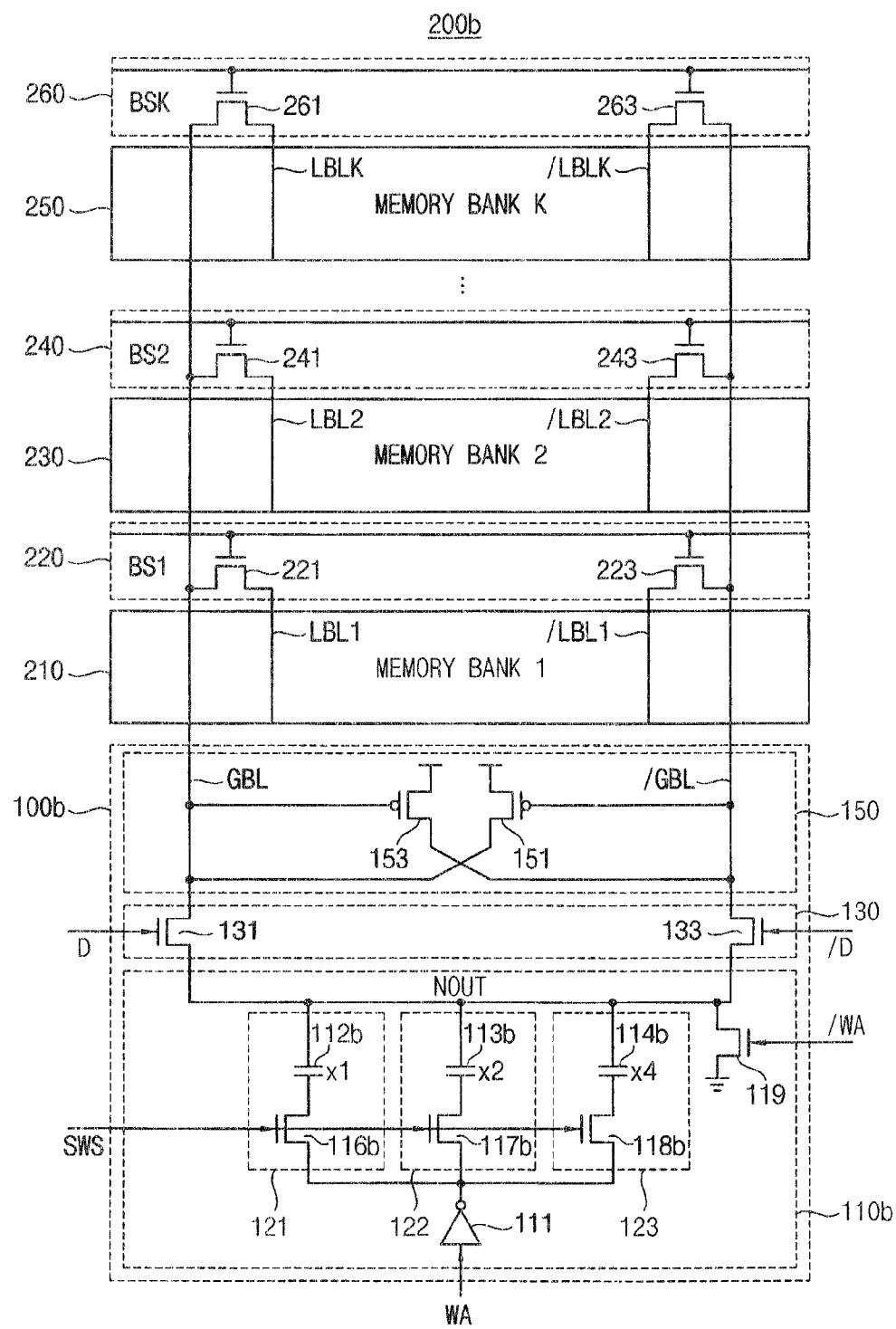
FIG. 7 is a circuit diagram of a semiconductor memory device including a negative voltage generator according to another exemplary embodiment.

FIG. 7 is a circuit diagram of a semiconductor memory device 200a including a negative voltage generator according to another exemplary embodiment.

Referring to FIG. 7, the semiconductor memory device 200b includes N memory banks 210, 230 and 250, where K is an integer greater than 1. For example, the semiconductor memory device 200b may include two, four or eight memory banks. Each memory bank 210, 230 and 250 may include a plurality of rows and a plurality of columns of memory cells (e.g., SRAM cells). The semiconductor memory device 200b may further include K bank select units 220, 240 and 260. The bank select units 220, 240 and 260 operate as a multiplexer that selectively connects the global bitline pair GBL and /GBL to the local bitline pairs LBL1, /LBL1, LBL2, /LBL2, LBLK and /LBLK in response to bank select signals BS1, BS2 and BSK, respectively. Although FIG. 7 illustrates an example of the semiconductor memory device 200b including the K bank select units 220, 240 and 260, the semiconductor memory device 200b according to various alternative embodiments may include one bank select unit that controls the connections of the local bitline pairs LBL1, /LBL1, LBL2, /LBL2, LBLK and /LBLK to the global bitline pair GBL and /GBL.

The semiconductor memory device 200b further includes a negative voltage generator 100b. The negative voltage generator 100b includes a negative voltage generating unit 110b, a switching unit 130 and a positive (high) voltage applying unit 150. The negative voltage generating unit 110b generates a negative voltage, and includes capacitors and switches (112b, 113b, 114b 116b, 117b and 118b) that implement a variable capacitance unit which behaves as a variable capacitor having at least three selectable discrete capacitance values.

The switching unit 130 switchably connects the negative voltage generating unit 110b to the first global bitline GBL, or to the second global bitline /GBL, which distributes the charged stored in the variable capacitance unit (112b, 113b, 114b 116b, 117b and 118b). The positive (high) voltage applying unit 150 applies a positive (high) voltage to the global bitline (in the selected global bitline pair) to which the negative voltage generating unit 110b is not connected.

The negative voltage generating unit 110b includes an inverter 111, a plurality of switch-capacitor circuits 121, 122 and 123 and a pull-down transistor 119. The inverter 111 inverts a write assist signal WA received from a logic block (not shown) of the semiconductor memory device 200b. The plurality of switch-capacitor circuits 121, 122 and 123 are connected in parallel between an output node NOUT of the negative voltage generating unit 110b and an output terminal of the inverter 111, and implement the variable capacitance unit that behaves as a variable capacitor having at least three selectable discrete capacitance values. Each switch-capacitor circuit 121, 122 and 123 includes one coupling capacitor 112b, 113b and 114b and one switch 116b, 117b and 118b that controls the connection of the coupling capacitor 112b, 113b and 114b. In some embodiments, each switch 116b, 117b and 118b is independently switchable. The pull-down transistor 119 pulls down a voltage of the output node NOUT in response to an inverted write assist signal /WA received from the control block.

In some embodiments, the negative voltage generating unit 110b includes a first switch-capacitor circuit 121, a second switch-capacitor circuit 122 and a third switch-capacitor circuit 123 as the plurality of switch-capacitor circuits 121, 122 and 123. The first switch-capacitor circuit 121 includes a first coupling capacitor 112b and a first switch 116b. The second switch-capacitor circuit 122 includes a second coupling capacitor 113b and a second switch 117b. The third switch-capacitor circuit 123 includes a third coupling capacitor 114b and a third switch 118b. The first coupling capacitor 112b, the second coupling capacitor 113b and the third coupling capacitor 114b may have different capacitances. For example, the capacitance of the second coupling capacitor 113b may be about double the capacitance of the first coupling capacitor 112b, and the capacitance of the third coupling capacitor 114b may be about double the capacitance of the second coupling capacitor 113b, or about four times the capacitance of the first coupling capacitor 112b. Further, the first switch 116b, the second switch 117b and the third switch 118b may have different threshold voltages so that they may be selectively turned ON in response to a switching signal SWS received from the control block. For example, in a case where a coupling capacitance three times greater than the capacitance of the first coupling capacitor 112b is required, the first switch 116b and the second switch 117b may be turned ON in response to the switch signal SWS, and the negative voltage generating unit 110b may generate the negative voltage using the first and second coupling capacitors 112b and 113b. In a case where a coupling capacitance five times greater than the capacitance of the first coupling capacitor 112b is required, the first switch 116b and the third switch 118b may be turned ON in response to the switch signal SWS, and the negative voltage generating unit 110b may generate the negative voltage using the first and third coupling capacitors 112b and 114b. Accordingly, the negative voltage generating unit 110b may provide a negative bitline voltage having substantially the same voltage level to each of the memory banks 210, 230 and 250 (at different times) by selectively using the coupling capacitors 112b, 113b and 114b.

As described above, even if the number of rows of at least one of the memory banks 210, 230 and 250 is different from the number of rows of other memory banks, and even if the parasitic capacitance of the local bitline of the at least one memory bank is different from the parasitic capacitance of the local bitline of the other memory banks, the negative voltage generator 100b according to exemplary embodiments can provide a negative bitline voltage having substantially the same voltage level to each of the memory banks 210, 230 and 250 (at different times) by selectively using the coupling capacitors 112b, 113b and 114b.

Figure 8:
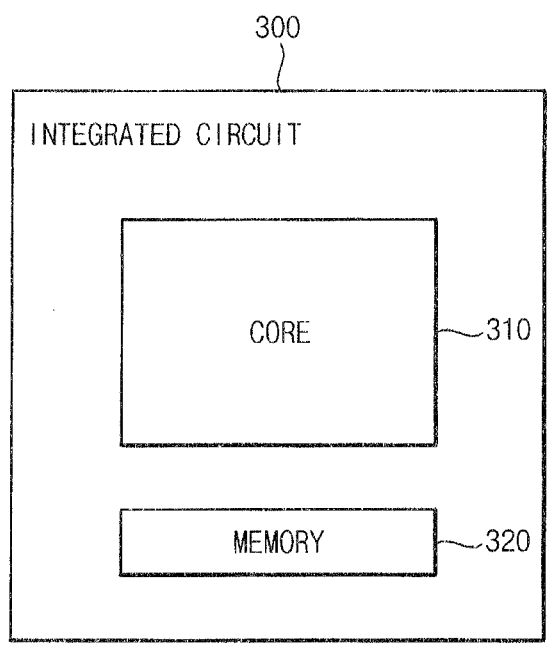
FIG. 8 is a block diagram of an integrated circuit including a semiconductor memory device according to any embodiment.

FIG. 8 is a block diagram of an integrated circuit including a semiconductor memory device according to any embodiment within the claims.

Referring to FIG. 8, an integrated circuit 300 includes a core 310 and a semiconductor memory device 320. For example, the integrated circuit 300 may be an application processor (AP) of a hand held computing device, a microprocessor, a central processing unit (CPU), an application-specific integrated circuit (AMC), or the like. The semiconductor memory device 320 may be one of the semiconductor memory devices 200a or 200b according to the exemplary embodiments, or semiconductor memory devices according to any of various other embodiments within the claims.

For example, the core 310 may be a logic core that performs a predetermined logic operation, or may be a processor core that an instruction or data and processes the fetched instruction and/or the fetched data. The core 310 may use the semiconductor memory device 320 as a system memory and/or as a cache memory. For example, the core 310 may temporarily store an instruction or data provided from an external memory device (not shown) in the semiconductor memory device 320 and later fetch the instruction or data.

The semiconductor memory device 320 includes a negative voltage generator that provides a negative bitline voltage to a first memory cell in a first memory bank when the semiconductor memory device 320 performs a first write operation and to a second memory cell in a second memory bank when the semiconductor memory device 320 performs a second operation. The negative voltage generator provides a negative bitline voltage having substantially the same voltage level to memory banks having different number of rows by using coupling capacitors selectively connected to have a capacitance corresponding to the number of rows of the memory bank to which data is written. Accordingly, the semiconductor memory device 320 can rapidly and correctly perform the write operations.

Figure 9:
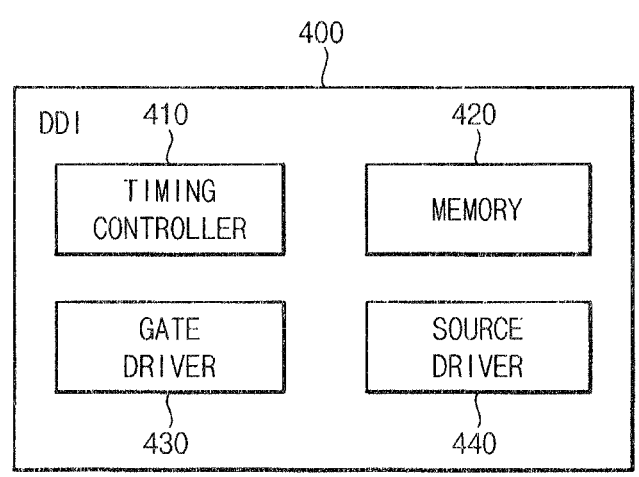
FIG. 9 is a block diagram of a display driver integrated circuit including a semiconductor memory device according to any embodiment.

FIG. 9 is a block diagram of a display driver integrated circuit including a semiconductor memory device according to any embodiment within the claims.

Referring to FIG. 9, a display driver integrated circuit 400 includes a timing controller 410, a semiconductor memory device 420, a gate driver 430 and a source driver 440.

The timing controller 410 may control operations of the gate driver 430 and the source driver 440 in response to a timing signal received from an external host (not shown). The semiconductor memory device 420 may store image data provided from the external host on a frame basis or on a line basis. The gate driver 430 may turn ON/OFF pixel transistors (e.g., thin-film transistors (TFTs)) included in a display panel (not shown), and the source driver 440 may apply a data voltage to each of the pixels included in the display panel based on the image data stored in the semiconductor memory device 420.

The semiconductor memory device 420 includes a negative voltage generator that provides a negative bitline voltage to a memory cell when the semiconductor memory device 420 performs a write operation. The negative voltage generator provide the negative bitline voltage having substantially the same voltage level (at different times) to different memory banks having different numbers of rows by using coupling capacitors selectively connected to have a capacitance corresponding to the number of rows of the memory bank to which data is written. Accordingly, the semiconductor memory device 420 can rapidly and correctly perform the write operation. The semiconductor memory device 420 may be one of the semiconductor memory devices 200a or 200b according to the exemplary embodiments, or semiconductor memory devices according to any of various other embodiments within the claims.

Figure 10:
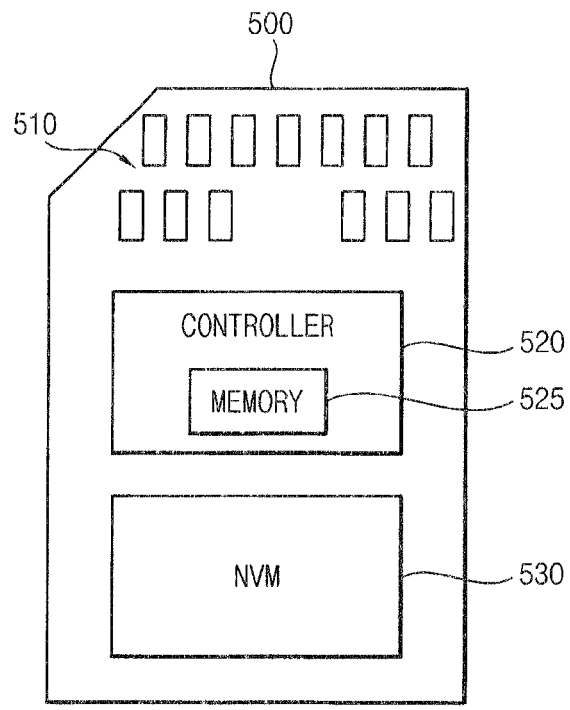
FIG. 10 is a block diagram of a memory card including a semiconductor memory device according to any embodiment.

FIG. 10 is a block diagram of a memory card including a semiconductor memory device according to any embodiment within the claims.

Referring to FIG. 10, a memory card 500 includes a plurality of connection pins 510, a controller 520, a semiconductor memory device 525 and a nonvolatile memory device 530. According to exemplary embodiments, the memory card 500 may be any type of memory card or solid state drive (SSD), such as a multimedia card (MMC), a secure digital (SD) card, a micro-SD card, a memory stick, an identification (ID) card, a personal computer memory card international association (PCMCIA) card, a chip card, a universal serial bus (USB) card, a smart card, a compact flash (CF) card, an embedded multimedia card (eMMC), a hybrid embedded multimedia card (hybrid eMMC), etc.

The plurality of connection pins 510 may be connected to an external host (not shown) to transmit/receive signals between the external host and the memory card 500. The plurality of connection pins 510 may include a clock pin, a command pin, a data pin and/or a reset pin. According to exemplary embodiments, the memory card 500 may be attached to any computing system, such as a mobile phone, a smart phone, a personal digital assistant (PDA), a portable multimedia player (PMP), a digital camera, a music player, a portable game console, a navigation device, a personal computer (PC), a server computer, a workstation, a tablet computer, a laptop computer, a digital television, a set-top box, etc.

The controller 520 may receive data from the external host, and may control the nonvolatile memory device 530 to store the received data. Further, the controller 520 controls the nonvolatile memory device 530 to provide the stored data to the external host. The controller 520 may employ the semiconductor memory device 525 as a buffer memory to temporarily store the data transferred between the external host and the nonvolatile memory device 530. In some embodiments, the semiconductor memory device 525 may store an address translation table for managing blocks of the nonvolatile memory device 530.

The semiconductor memory device 525 includes a negative voltage generator that provides a negative bitline voltage to a memory cell when the semiconductor memory device 525 performs a write operation. The negative voltage generator provides a negative bitline voltage having substantially the same voltage level to different memory banks having different numbers of rows by using a coupling capacitance having a capacitance corresponding to the number of rows of the memory bank to which data is written. Accordingly, the semiconductor memory device 525 can rapidly and correctly perform the write operation. The semiconductor memory device 525 may be one of the semiconductor memory devices 200a or 200b according to the exemplary embodiments, or a semiconductor memory device according to any of various other embodiments within the claims.

Figure 11:
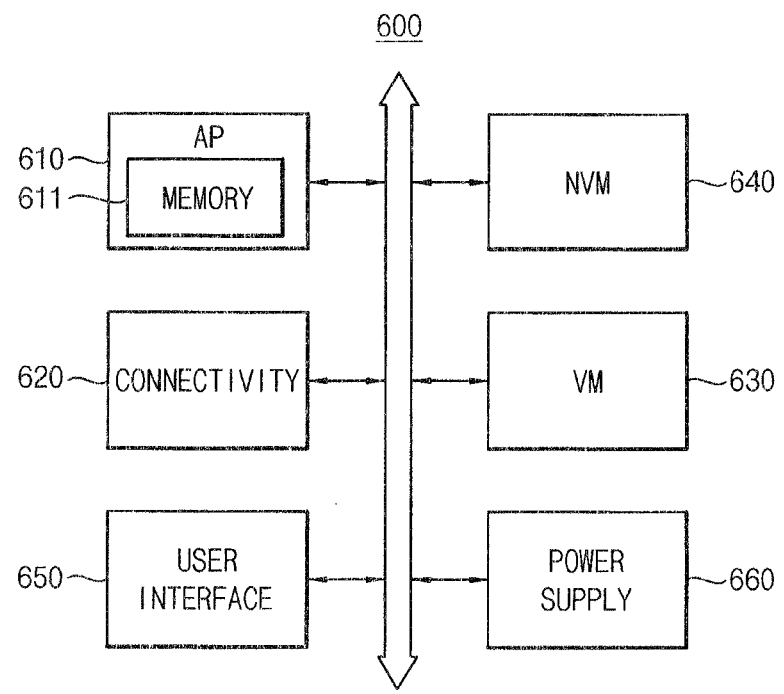
FIG. 11 is a block diagram of a mobile system including a semiconductor memory device according to any embodiment.

FIG. 11 is a block diagram of a mobile system including a semiconductor memory device according to any embodiment within the claims.

Referring to FIG. 11, a mobile system 600 includes an application processor 610, a connectivity unit 620, a volatile memory device 630, a nonvolatile memory device 640, a user interface 650 and a power supply 660. The mobile system 600 may be any type of mobile system, such as a mobile phone, a smart phone, a personal digital assistant (PDA), a portable multimedia player (PMP), a digital camera, a portable game console, a music player, a camcorder, a video player, a navigation system, etc.

The application processor 610 may execute applications, such as an internet browser, a game application, a video player application, etc. The application processor 610 employs a semiconductor memory device 611 as a system memory or as a cache memory to temporarily store an instruction or data from the volatile memory device 630 or the nonvolatile memory device 640. The semiconductor memory device 611 includes a negative voltage generator that provides a negative bitline voltage to a memory cell when the semiconductor memory device 611 performs a write operation. The semiconductor memory device 611 may be one of the semiconductor memory devices 200a or 200b according to the exemplary embodiments, or semiconductor memory devices according to any of various other embodiments within the claims. The volatile memory device 630 may further include one of the semiconductor memory devices 200a or 200b according to the exemplary embodiments, or a semiconductor memory device according to any of various other embodiments within the claims.

The negative voltage generator provides a negative bitline voltage having substantially the same voltage level to different memory banks having different numbers of rows by using a variable capacitance unit having a capacitance corresponding to the number of rows of the memory bank to which data is written. Accordingly, the semiconductor memory device 611 can rapidly and correctly perform the write operation. According to exemplary embodiments, the application processor 610 may include one processor core or multiple processor cores. For example, the application processor 610 may be a multi-core processor, such as a dual-core processor, a quad-core processor, a hexa-core processor, etc.

The connectivity unit 620 may communicate with an external device. For example, the connectivity unit 620 may perform a USB protocol communication, an Ethernet protocol communication, a near field communication (NFC), a radio frequency identification (RFID) communication, a mobile telecommunication, a memory card communication, etc.

The volatile memory device 630 may store data processed by the application processor 610, or may serve as a working memory. For example, the volatile memory device 630 may be implemented by a dynamic random access memory (DRAM), a static random access memory (SRAM), a mobile DRAM, or the like.

The nonvolatile memory device 640 may store a boot image for booting the mobile system 600. For example, the nonvolatile memory device 640 may be implemented by an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), or the like.

The user interface 650 may include at least one input device, such as a keypad, a touch screen, a microphone etc., and at least one output device, such as a display device, a speaker, etc. The power supply 660 supplies the mobile system 600 with power. In some embodiments, the mobile system 600 may further include an image sensor and a camera image processor (CIS), and a modem, such as a baseband chipset. For example, the modem may be a modem processor that supports at least one of various communications, such as GSM, GPRS, WCDMA, etc.

According to exemplary embodiments, the mobile system 600 and/or components of the mobile system 600 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WIT), or wafer-level processed stack package (WSP).

Figure 12:
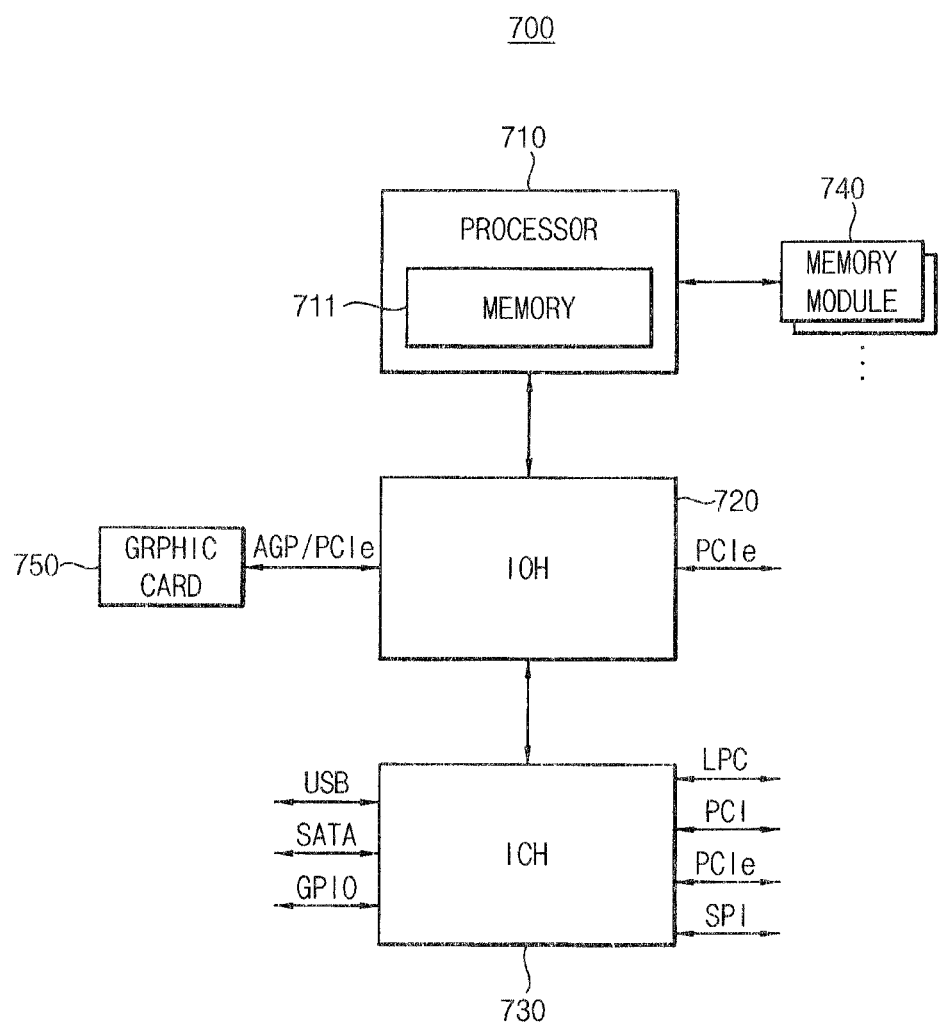
FIG. 12 is a block diagram of a computing system including a semiconductor memory device according to any embodiment.

FIG. 12 is a block diagram of a computing system according to exemplary embodiments.

Referring to FIG. 12, a computing system 700 includes a processor 710, an input/output hub 720, an input/output controller hub 730, at least one memory module 740 and a graphic card 750. The computing system 700 may be any type of computing system, such as a personal computer (PC), a server computer, a workstation, a tablet computer, a laptop computer, a mobile phone, a smart phone, a personal digital assistant (PDA), a portable multimedia player (PMP), a digital camera, a digital television, a set-top box, a music player, a portable game console, a navigation device, etc.

The processor 710 performs various calculations or tasks. For example, the processor 710 may be a microprocessor, a central process unit (CPU), a digital signal processor, or the like, performing executable code. The processor 710 may include a semiconductor memory device 711 employed as a cache memory to temporarily store an instruction or data from the memory module 740. The semiconductor memory device 711 includes a negative voltage generator according to any embodiment (e.g., 200a, 200b) of the inventive concept, that provides a negative bitline voltage to a memory cell when the semiconductor memory device 711 performs a write operation. The negative voltage generator provides the negative bitline voltage having substantially the same voltage level to different memory banks having different numbers of rows by using a coupling capacitance having a capacitance varying to correspond to the number of rows of the memory bank to which data is written. Accordingly, the semiconductor memory device 711 can rapidly and correctly perform the write operation. The processor 710 may include one processor core or multiple processor cores. For example, the processor 710 may be a multi-core processor, such as a dual-core processor, a quad-core processor, a hexa-core processor, etc. Although FIG. 12 illustrates an example of the computing system 700 including one processor 710, the computing system 700 according to alternative embodiments may include one or more processors, each including a semiconductor memory device 711 employed as a cache memory.

The processor 710 may include a memory controller (not shown) that controls an operation of the memory module 740. The memory controller included in the processor 710 may be referred to as an integrated memory controller (IMC). A memory interface between the memory module 740 and the memory controller may be implemented by one channel including a plurality of signal lines, or by a plurality of channels. Each channel may be connected to at least one memory module 740. In some embodiments, the memory controller may be included in the input/output hub 720. The input/output huh 720 including the memory controller may be referred to as a memory controller hub (MCH).

The input/output hub 720 may manage data transfer between the processor 710 and devices, such as the graphic card 750. The input/output hub 720 may be connected to the processor 710 via one of various interfaces, such as a front side bus (FSB), a system bus, a HyperTransport, a lightning data transport (LDT), a QuickPath interconnect (QPI), a common system interface (CS1), etc. Although FIG. 12 illustrates an example of the computing system 700 including one input/output hub 720, according to exemplary embodiments, the computing system 700 may include a plurality of input/output hubs.

The input/output hub 720 provides various interfaces with devices. For example, the input/output hub 720 may provide an accelerated graphics port (AGP) interface, a peripheral component interface-express (PCIe), a communications streaming architecture (CSA) interface, etc.

The graphic card 750 may be connected to the input/output hub 720 via the AGP or the PCIe. The graphic card 750 controls a display device (not shown) for displaying an image. The graphic card 750 may include an internal processor and an internal memory to process the image. In some embodiments, the input/output hub 720 may include an internal graphic device along with or instead of the graphic card 750. The internal graphic device may be referred to as an integrated graphics, and an input/output hub including the memory controller and the internal graphic device may be referred to as a graphics and memory controller hub (GMCH).

The input/output controller hub 730 may perform data buffering and interface arbitration to efficiently operate various system interfaces. The input/output controller hub 730 may be connected to the input/output hub 720 via an internal bus. For example, the input/output controller hub 730 may be connected to the input/output hub 720 via one of various interfaces, such as a direct media interface (DMI), a hub interface, an enterprise Southbridge interface (ESI), PCIe, etc. The input/output controller hub 730 may provide various interfaces with peripheral devices. For example, the input/output controller hub 730 may provide a universal serial bus (USB) port, a serial advanced technology attachment (sATA) port, a general purpose input/output (GPIO), a low pin count (LPC) bus, a serial peripheral interface (SPI), a PCI, a PCIe, etc.

In some embodiments, the processor 710, the input/output hub 720 and the input/output controller hub 730 may be implemented as separate chipsets or separate integrated circuits. In other embodiments, at least two of the processor 710, the input/output hub 720 and the input/output controller hub 730 may be implemented as one chipset.

The foregoing is illustrative of exemplary embodiments and is not to be construed as limiting thereof. Although exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A negative voltage generator, comprising:
a negative voltage generating unit including a first coupling capacitor and a second coupling capacitor, and configured to select at least one of the first and second coupling capacitors corresponding to a parasitic capacitance of a bit line to be charged by the selected coupling capacitors, and to charge the at least one selected coupling capacitor to a negative voltage; and
a switching unit configured to select the bitline to be charged in response to the data, and to connect the at least one charged coupling capacitor to the selected bitline,
wherein the first coupling capacitor has a first electrode and a second electrode connected to an output node of the negative voltage generating unit, and the second coupling capacitor has a third electrode and a fourth electrode connected to the output node, and
wherein negative voltage generating unit comprises:
an inverter configured to invert a write assist signal;
a first switch configured to switchably connect the output terminal of the inverter to the first electrode of the first coupling capacitor in response to a first bank select signal;
an OR-gate configured to perform an OR operation on the first bank select signal and a second bank select signal;
a second switch configured to selectively connect the output terminal of the inverter to the third electrode of the second coupling capacitor in response to an output signal of the OR-gate; and
a pull-down transistor configured to pull down the voltage of the output node in response to an inverted write assist signal.

2. The negative voltage generator of claim 1, wherein the parasitic capacitance of the bit line to be charged depends upon the number of rows of a memory bank to which data is to be written.

3. The negative voltage generator of claim 1, wherein the selected bitline is one of a bitline pair having complementary first and second bitlines.

4. The negative voltage generator of claim 3, further comprising a positive voltage applying unit configured to apply a positive voltage to the unselected bitline of the bitline pair.

5. The negative voltage generator of claim 1,
wherein the first bank select signal has a logic high level when the data is written to a first memory bank having a first number of rows, and the second bank select signal has a logic high level when the data is written to a second memory bank having a second number of rows that is different from the first number of rows, and
wherein all of the first and second coupling capacitors are charged to the negative voltage if the first bank select signal has the logic high level, and if the second bank select signal has the logic high level then only the second coupling capacitor is charged to the negative voltage.

6. The negative voltage generator of claim 3,
wherein the positive voltage applying unit comprises:
a first PMOS transistor having its source connected to a power supply voltage, its drain connected to the first bitline, and a control gate connected to the second bitline; and
a second PMOS transistor having its source connected to the power supply voltage, its drain connected to the second bitline, and a control gate connected to the first bitline.

7. A semiconductor memory device, comprising:
a first memory bank including N first memory cells connected to a first local bitline;
a first bank select unit configured to connect a global bitline to the first local bitline in response to a first bank select signal;
a second memory bank including M second memory cells connected to a second local bitline; a second bank select unit configured to connect the global bitline to the second local bitline in response to a second bank select signal; and
a negative voltage generator including a capacitance unit having a plurality of capacitance states, the negative voltage generator configured to charge the capacitance unit in a first capacitance state to a negative voltage and then to share the negative charge in the capacitance unit with the global bitline while data is written to the first memory bank, and to charge the capacitance unit in a second capacitance state to the negative voltage and then to share the negative charge in the capacitance unit with the global bitline while the data is written to the second memory bank.

8. The semiconductor memory device of claim 7,
wherein the first capacitance state corresponds to the sum of the parasitic capacitance of the global bitline and the parasitic capacitance of the first local bitline, and
wherein the second capacitance state corresponds to the sum of the parasitic capacitance of the global bitline and the parasitic capacitance of the second local bitline.

9. The semiconductor memory device of claim 7, wherein the voltage level of the negative bitline voltage applied to the first local bitline while the first bank select signal has a logic high level is substantially the same as the voltage level of the negative bitline voltage applied to the second local bitline while the second bank select signal has a logic high level.

10. The semiconductor memory device of claim 7, wherein the number of the first memory cells connected to the first local bitline is different from the number of the second memory cells connected to the second local bitline.

11. An apparatus comprising a semiconductor memory device including:
a negative voltage generator including a capacitance unit having a plurality of capacitance states,
wherein the negative voltage generator is configured to charge the capacitance unit in a first capacitance state to a negative voltage and then to share a negative charge in the capacitance unit with a global bitline and a first local bitline while data is written to a first memory bank,
wherein the negative voltage generator is further configured to charge the capacitance unit in a second capacitance state to the negative voltage and then to share the negative charge in the capacitance unit with the global bitline and a second local bitline while the data is written to a second memory bank, and wherein a parasitic capacitance of the first local bitline in the first memory bank is different from a parasitic capacitance of the second local bitline in the second memory bank.

12. The apparatus of claim 11, wherein the apparatus is a computing system implemented as one of a personal computer (PC), a server computer, a workstation, a tablet computer, a laptop computer, a mobile phone, a smart phone, a personal digital assistant (PDA), a portable multimedia player (PMP), a digital camera, a digital television, a set-top box, a music player, a portable game console, a navigation device.

13. The apparatus of claim 11, wherein the apparatus is a nonvolatile memory device implemented by one of an electrically erasable programmable read-only memory (EEPROM), flash memory, a phase change random access memory (PRAM), a resistance random access memory (RRAM), a nano floating gate memory (NFGM), a polymer random access memory (PoRAM), a magnetic random access memory (MRAM), or a ferroelectric random access memory (FRAM).

14. The apparatus of claim 11, wherein the apparatus is a mobile system packaged in the form of package on package (PoP), ball grid array (BGAs), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

15. A negative voltage generator, comprising:
a negative voltage generating unit including a first coupling capacitor and a second coupling capacitor, and configured to select at least one of the first and second coupling capacitors corresponding to a parasitic capacitance of a bit line to be charged by the selected coupling capacitor, and to charge the at least one selected coupling capacitor to a negative voltage; and
a switching unit configured to select the bitline to be charged in response to the data, and to connect the at least one charged coupling capacitor to the selected bitline,
wherein the negative voltage generating unit comprises:
an inverter configured to invert a write assist signal;
first and second switch-capacitor circuits connected between an output node of the negative voltage generating unit and an output terminal of the inverter, the first and second switch-capacitor circuits including the first and second coupling capacitors, respectively; and
a pull-down transistor configured to pull down the voltage of the output node in response to an inverted write assist signal.

* * * * *